(12) United States Patent
Basol

(10) Patent No.: US 7,825,329 B2
(45) Date of Patent: Nov. 2, 2010

(54) THIN FILM SOLAR CELL MANUFACTURING AND INTEGRATION

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 39 days.

(21) Appl. No.: 11/969,218

(22) Filed: Jan. 3, 2008

(65) Prior Publication Data

US 2008/0202584 A1 Aug. 28, 2008

Related U.S. Application Data

(60) Provisional application No. 60/883,336, filed on Jan. 3, 2007.

(51) Int. Cl.
*H01L 31/0224* (2006.01)
*H01L 31/0256* (2006.01)

(52) U.S. Cl. ............. 136/256; 136/263; 136/265; 136/252; 438/98; 438/57; 438/85

(58) Field of Classification Search ......... 136/252–265; 427/74; 438/57–98
See application file for complete search history.

(56) References Cited

U.S. PATENT DOCUMENTS

| | | | | |
|---|---|---|---|---|
| 4,590,327 A | * | 5/1986 | Nath et al. | 136/256 |
| 4,633,033 A | * | 12/1986 | Nath et al. | 136/256 |
| 5,626,688 A | * | 5/1997 | Probst et al. | 136/265 |
| 2005/0098205 A1 | * | 5/2005 | Roscheisen et al. | 136/263 |
| 2005/0202589 A1 | | 9/2005 | Basol | |
| 2005/0236032 A1 | * | 10/2005 | Aoki | 136/252 |
| 2006/0121701 A1 | | 6/2006 | Basol | |
| 2007/0093006 A1 | | 4/2007 | Basol | |
| 2008/0011349 A1 | * | 1/2008 | Raffaele et al. | 136/249 |
| 2008/0128019 A1 | * | 6/2008 | Lopatin et al. | 136/252 |

\* cited by examiner

*Primary Examiner*—Jennifer K Michener
*Assistant Examiner*—Jayne Mershon
(74) *Attorney, Agent, or Firm*—Pillsbury Winthrop Shaw Pittman, LLP

(57) ABSTRACT

A method of forming a Group IBIIIAVIA solar cell absorber which includes an active portion and an electrically resistive portion. The absorber is interposed between a base layer and a transparent conductive layer. The electrically resistive portion increases resistance between the base layer and a connector layer that is formed on the transparent conductive layer. The connector layer comprises the busbar and the fingers of the solar cell. The busbar is preferably placed over the electrically resistive portion while the fingers extend over the active portion of the absorber layer.

19 Claims, 7 Drawing Sheets

THIN FILM SOLAR CELL MANUFACTURING AND INTEGRATION

CROSS-REFERENCE TO RELATED APPLICATIONS

This application claims the benefit of provisional application Ser. No. 60/883,336 filed on Jan. 3, 2007.

BACKGROUND

1. Field

The present invention relates to thin film solar cell structures and methods of manufacturing them.

2. Description of the Related Art

Solar cells are photovoltaic (PV) devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods. Group IIB-VIA compounds such as. CdTe, Group IBIIIAVIA compounds and amorphous Group IVA materials such as amorphous Si and amorphous Si alloys are important thin film materials that are being developed.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(SySe_{1-y})_k$, where $0 \leq x \leq 1$, $0 \leq y \leq 1$ and k is approximately 2, have already been employed in solar cell structures that yielded conversion efficiencies approaching 20%. Among the family of compounds, best efficiencies have been obtained for those containing both Ga and In, with a Ga amount in the 15-25%. Recently absorbers comprising Al have also been developed and high efficiency solar cells have been demonstrated using such absorbers.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13 or a contact layer, which is previously deposited on the substrate 11 and which acts as the electrical ohmic contact to the device. The most commonly used contact layer or conductive layer in the solar cell structure of FIG. 1 is Molybdenum (Mo). If the substrate itself is a properly selected conductive material such as a Mo foil, it is possible not to use a conductive layer 13, since the substrate 11 may then be used as the ohmic contact to the device. The conductive layer 13 may also act as a diffusion barrier in case the metallic foil is reactive. For example, foils comprising materials such as Al, Ni, Cu may be used as substrates provided a barrier such as a Mo layer is deposited on them protecting them from Se or S vapors. The barrier is often deposited on both sides of the foil to protect it well. After the absorber film 12 is grown, a transparent layer 14 such as a CdS, ZnO or CdS/ZnO stack is formed on the absorber film. In the case of the CdS/ZnO stack, the CdS may be called a buffer layer and ZnO is a transparent conductive oxide. Other buffer layers such as Zn(S,O,OH) etc., and other transparent conductive oxides such as indium tin oxide may be utilized in the structure of the transparent layer 14. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

CdTe solar cell structure is typically a superstrate structure that is obtained by first depositing a transparent conductive layer (TCO) on a transparent substrate such as glass, and then depositing layers of CdS, CdTe and an ohmic contact. The ohmic contact is traditionally a metallic contact such as Ni or an ink deposited material comprising graphite. A small amount of Cu is also traditionally added to the ohmic contact composition to improve its performance. CdTe solar cells with above 16% conversion efficiency have been demonstrated with such structures.

Thin film photovoltaic devices may be manufactured in the form of monolithically integrated modules where electrical interconnection of individual solar cells in a series is achieved on a single substrate, such as a glass sheet, during the film deposition steps and a module with high voltage is obtained. Alternatively thin film solar cells may be manufactured individually and then connected in series, through use of soldering or conductive epoxies just like Si solar cells to obtain high voltage modules. In this case, solar cells often need to be large area, one dimension being more than 1", typically more than 3". Such large area requires deposition of finger patterns over the top conducting layer of the solar cell, such as the transparent layer 14 in FIG. 1.

FIGS. 2a and 2b show a top view and a cross-sectional view (taken at location A-A'), respectively, of an exemplary prior art $Cu(In,Ga)(Se,S)_2$ solar cell 20 fabricated on a conductive foil substrate 25 such as a stainless steel foil or an aluminum-based foil. The solar cell 20 has an optional back contact layer 26, an active layer 27, a transparent conductive layer 28, and a finger pattern comprising fingers 21 and a busbar 22. If the conductive foil substrate 25 itself is a good ohmic contact material (such as Mo) there may not be a need for a back contact layer 26. Otherwise a material such as Mo may be used to form a back contact layer 26. As an example, the thicknesses of the transparent conductive layer 28 and the active layer 27 are 500-1000 nm and 1000-2000 nm, respectively. The active layer 27 may comprise an absorber layer such as a $Cu(In,Ga)(Se,S)_2$ and a junction partner such as a CdS buffer layer which lies between the absorber layer and the transparent conductive layer 28. The thickness of the busbar 22 and the fingers 21 may be in the range of 12000-120000 nm, busbar 22 being thicker than the fingers 21. When solar cells with the structure shown in FIGS. 2a and 2b are interconnected, the bottom electrode, or the conductive foil substrate, of one cell is electrically connected to the busbar of the next cell. During this interconnection process ribbons may be soldered onto the busbars and bottom electrodes of the cells or the cells may be laid on each other in a shingled manner so that the bottom electrode of one cell touches the busbar of the next cell. After positioning this way, cells may be pressed together and heat may be applied to assure good contact. It should be appreciated that the thin film structure of FIGS. 2a and 2b is rather fragile because the active layer thickness is only 1000-2000 nm. Physical stress during shingle interconnection or thermal stress generated by heating or soldering processes cause damage to the active layer 27, especially right under the busbar 22, and result in electrical shorts between the busbar 22 and the conductive foil substrate 25 through the damaged active layer. Another shorting path is the exposed edge wall 25a of the conductive foil substrate 25 at the edge region 29. Interconnect soldering materials, conductive epoxies, conductive inks etc. may flow along this exposed edge wall 25a and create an electrical short between the transparent conductive layer 28 and the conductive foil substrate 25. Such shorts reduce yield and deteriorate efficiency of the modules manufactured using thin film solar cells. In prior work, approaches have been developed to reduce or eliminate shunting effects in thin film structures. U.S. Pat. Nos. 4,590,327 and 4,633,033 discuss some of these approaches.

SUMMARY

An aspect of the present invention provides a solar cell structure. The structure includes a base, a layer formed on the base, and including a first portion and a second portion that is different than the first portion such that each of the first and the second portions are formed on the base and the second portion forms a pattern. The electrical resistivity of the second portion is higher than the electrical resistivity of the first portion, and the first portion forms an absorber layer. The structure further includes a transparent conductive layer formed over the layer, and a metallic connector formed on the transparent conductive layer, the metallic connector having a primary connector and secondary connectors attached to the primary connector, wherein the primary connector is substantially positioned over the pattern formed by the second portion of the layer without substantially extending over the first portion of the layer. The first portion includes at least one Group IB material, at least one group IIIA material and at least one Group VIA material, and the second portion includes at least two materials from a set of materials including at least one Group IB material, at least one group IIIA material and at least one Group VIA material. The molar ratio of Group IB material to Group IIIA material in the second portion is lower than the molar ratio of Group IB material to Group IIIA material in the first portion. The molar ratio of Group IB material to Group IIIA material in the second portion is less than 0.8 and the molar ratio of Group IB material to Group IIIA material in the first portion is more than 0.8.

Another aspect of the present invention provides a multilayer precursor structure to form solar cell absorbers that are used for manufacturing solar cells that will subsequently include a metallic connector. The structure includes a base, a stack formed on the base, and a Group VIA material layer formed on the stack. The stack includes first, second, and third un-reacted layers, the first layer including a Group IB material, the second layer including a Group IIIA material, and the third layer including another Group IIIA material. The stack further includes, within at least one of the first, second and third un-reacted layers a pattern corresponding to the metallic connector. The pattern being formed within the stack by a first portion that does not correspond to the pattern and a second portion that does correspond to the pattern, wherein the molar ratio of Group IB material to Group IIIA material in the second portion is lower than the molar ratio of Group IB material to Group IIIA material in the first portion.

Another aspect of the present invention includes a method of forming a solar cell. The method includes forming a layer on a base and forming a transparent conductive layer over the layer. The layer includes a first portion and a second portion that is different than the first portion such that each of the first and the second portions are formed on the base and the second portion forms a pattern. The electrical resistivity of the second portion is higher than the electrical resistivity of the first portion, and the first portion forms a Group IBIIIAVIA absorber layer. The method further includes forming a metallic connector layer on the transparent conductive layer. The connector has a primary connector and secondary connectors attached to the primary connector. The primary connector is substantially positioned over the pattern formed by the second portion of the layer without substantially extending over the first portion of the layer. The Group IBIIIAVIA absorber layer is a $Cu(In,Ga)(Se,S)_2$ and the Cu/(In+Ga) molar ratio in the second portion is lower than the Cu/(In+Ga) molar ratio in the first portion.

Another aspect of the present invention provides a method of forming a solar cell absorber on a continuous flexible workpiece using a roll-to-roll processing system. The method includes moving a section of the continuous flexible workpiece into the first deposition station of the system by feeding previously unrolled sections of the continuous flexible workpiece from a supply roll, depositing a first layer including a Group IB material in the first deposition station over at least a first region of the section of the continuous flexible workpiece while at least partially covering a second region with a mask, moving at least one of the mask and the second region relative to each other, thereby unmasking the second region, advancing the section of the continuous flexible workpiece into the second deposition station, depositing a second layer over the first region and the second region in the second deposition station, the second layer including at least one Group IIIA material, and annealing the deposited first and second layers in presence of at least one Group VIA material to form a Group IBIIIAVIA absorber layer.

DETAILED DESCRIPTION

The present invention provides a method for forming a solar cell absorber layer with an active portion and an electrically resistive portion. The electrically resistive portion or resistive portion increases resistance between an underlying base layer and a connector layer. A transparent conductive layer is between the absorber layer and the connector layer. The connector layer or the finger patterns comprises the busbar and the fingers of the solar cell. The busbar is preferably placed over the electrically resistive portion while the fingers extend over the active portion of the absorber layer. The absorber layer may be a Group IBIIIAVIA compound layer and may be formed by first forming a precursor stack including Group IB, Group IIIA and Group VIA materials. The precursor stack may be formed by sequentially depositing the layers of Group IB, Group IIIA and Group VIIA materials.

In one embodiment, the resistive portion may be formed by masking a portion of the base while depositing the Group IB material, such as Cu. Masking may be applied using a movable mask device having the shape of the resistive portion or by depositing a conventional masking material and then removing it after the Group IB material deposition. This way deposition of Group IB material on the masked region is minimized or prevented. The Group IIIA and Group VI material layers are then deposited on the Group IB layer and onto the area previously masked by the mask device or material. The conductive Group IB material deficiency in the masked region makes this portion of the precursor layer electrically resistive after it is reacted with a Group VIA material. Alternatively, the resistive portion may be formed by masking a portion of the precursor stack and adding a dopant material into the portion that is not masked. Dopant materials such as Na, Li and K, when added to the precursor layer, enhance conductivity at the selected region that they are added after the precursor is reacted with a Group VIA material and the Group IBIIIAVIA compound layer is formed.

Figure 1:
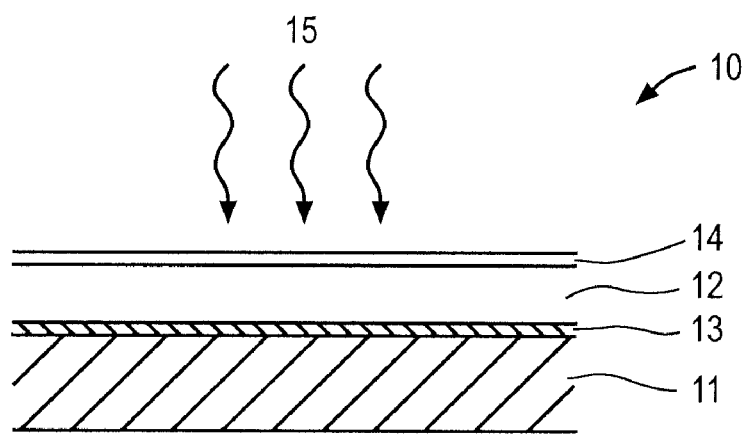
FIG. 1 is a cross-sectional view of a solar cell employing a Group IBIIIAVIA absorber layer.
Figure 2A:
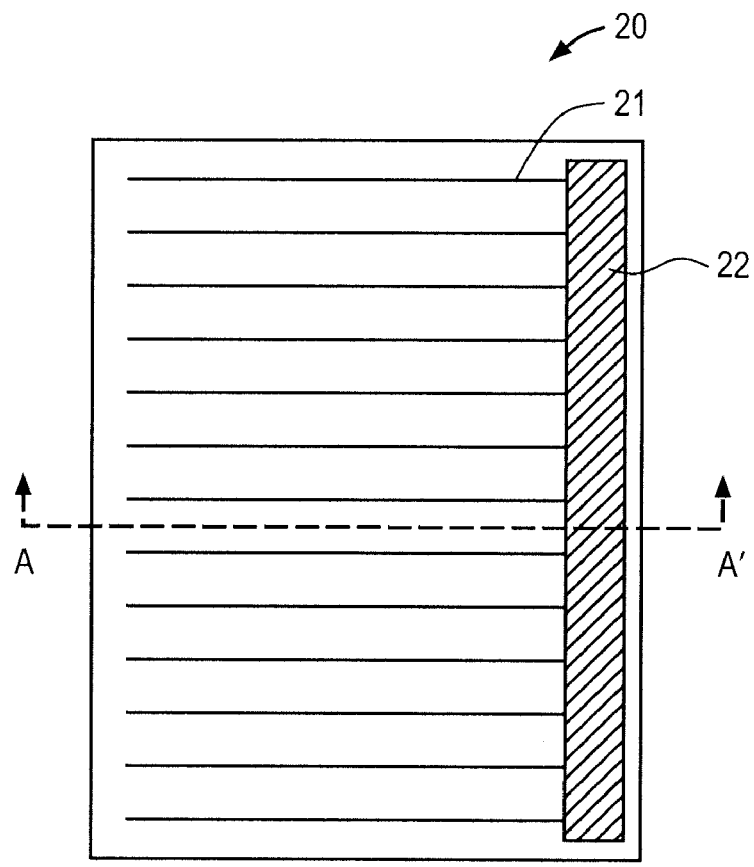
FIG. 2a is a top view of a prior-art thin film solar cell.
Figure 2B:
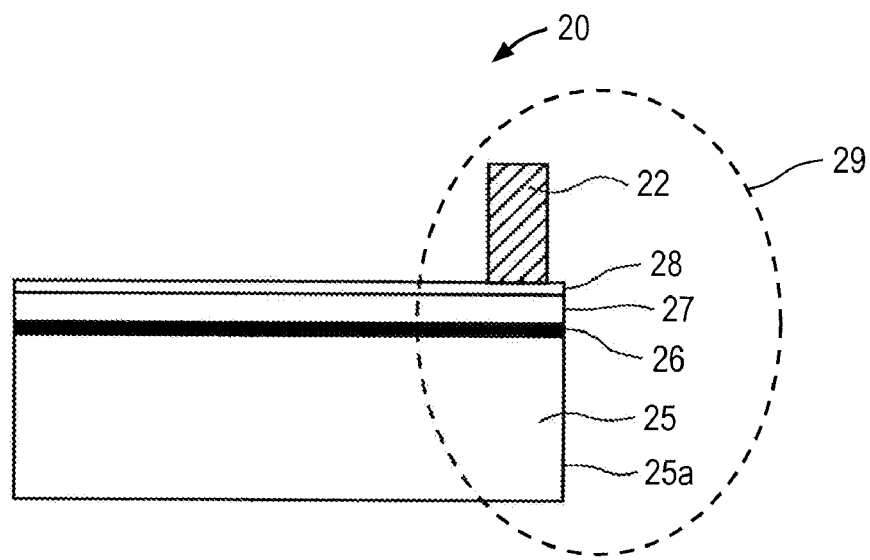
FIG. 2b is a cross-sectional view of a prior-art thin film solar cell.
Figure 3:
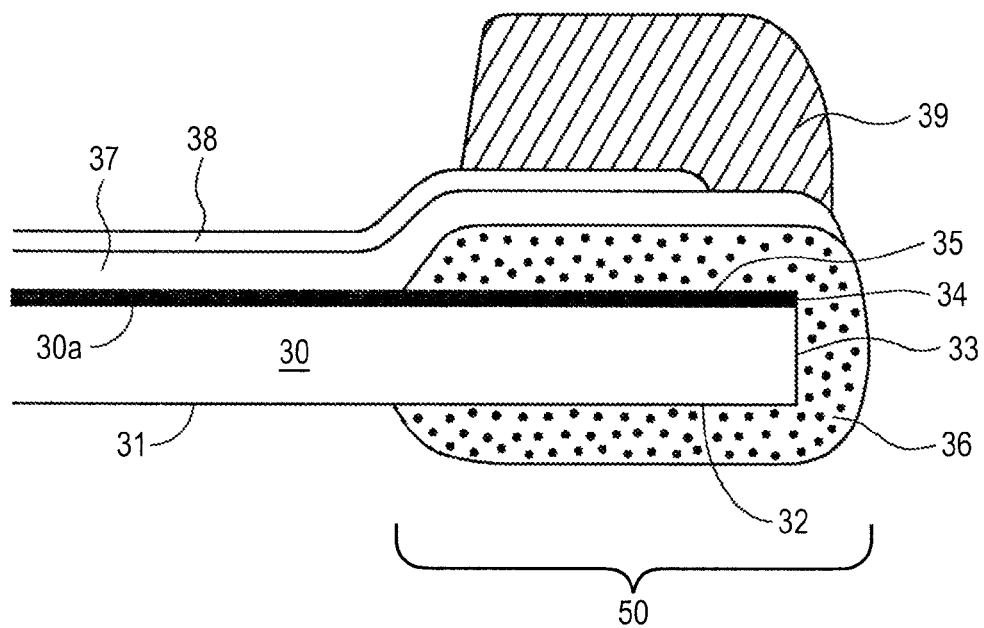
FIG. 3 is a cross-sectional view of an edge region of a solar cell fabricated in accordance with an embodiment of the present invention.

FIG. 3 shows a cross-sectional view of the edge region of an exemplary $Cu(In,Ga)(Se,S)_2$ solar cell structure fabricated in accordance with an embodiment of the present invention. The solar cell comprises a conductive substrate 30 with a top surface 30a, a bottom surface 31 and an edge side wall 33. Portion of the bottom surface 31 close to the edge side wall 33 is an edge bottom surface 32. A conductive layer 34, such as a Mo layer, is deposited on the top surface 30a. The conductive layer 34 acts as the ohmic contact to the device and may wrap around and also deposit on the edge side wall 33 (not shown). After depositing the conductive layer 34 an insulating layer 36 is deposited at the edge region where a busbar 39 will later be formed. The insulating layer 36 is formed on the edge top surface 35 of the conductive layer 34. It preferably also covers the edge side wall 33 of the conductive substrate 30. Optionally it may wrap around and extend onto the edge bottom surface 32 of the conductive substrate 30 as shown in FIG. 3. The insulating layer 36 may be a high temperature material deposited by various techniques such as physical vapor deposition (PVD), ink writing, sol-gel, dipping etc. Dipping the edge of the conductive substrate into an ink or sol-gel solution is especially suited to obtain the wrap-around structure shown in the figure. The insulating material may be an oxide such as silicon oxide, aluminum oxide etc., a polymeric material such as polyimide, or any other suitable material that is stable at temperatures used for processing of the solar cell. Next step in the process is the growth of an active layer 37 over the conductive layer 34. It should be noted that the active layer 37 includes an absorber layer, in this example a layer of $Cu(In,Ga)(Se,S)_2$, and it may optionally also include a buffer layer such as a CdS layer, an In—O—S layer, a ZnSe layer etc., on top of the absorber layer. A transparent conductive layer 38, such as a transparent conductive oxide (TCO) is deposited on the active layer 37. A finger pattern including fingers (not shown) and a busbar 39 is then formed over the transparent conductive layer 38 by aligning the busbar 39 with the insulating layer 36 so that the busbar 39 is formed over the insulating layer 36.

The structure in FIG. 3 is robust. The edge region of the cell is protected by the insulating layer 36. Electrical connection to the busbar 39 may be made by various means including soldering without fear of shorting because even if the active layer 37 is damaged during soldering at the edge region, the insulating layer 36 protects the top edge surface 35 of the conductive layer 34. Since conductivity in the plain of the active layer 37 is rather low, shunting through lateral conduction through the active layer is negligible.

It should be noted that although the conductive layer 34 extends all the way to the edge in FIG. 3, this is not necessary. The conductive layer 34 may not extend to underneath of the insulating layer 36. Similarly, the active layer 37 may not extend to over the insulating layer 36. It should be noted that if a technique such as a PVD method, electroless deposition approach or ink deposition technique, etc., is used the active layer 37 may deposit over the insulating layer 36 (unless masked) at the edge region (as shown in the figure) since these techniques can deposit films on insulators. One preferred method of this invention is using electrodeposition for the formation of at least part of the active layer 37. Such electrodeposition methods are reviewed and disclosed in applicant's co-pending U.S. patent application Ser. No. 11/081,308 filed Mar. 15, 2005 entitled Technique and Apparatus For Depositing Thin Layers of Semiconductors For Solar Cell Fabrication; U.S. patent application Ser. No. 11/266,013 filed Nov. 2, 2005 entitled Technique and Apparatus For Depositing Layers of Semiconductors For Solar Cell And Modular Fabrication; and U.S. patent application Ser. No. 11/462,685 filed Aug. 4, 2006 entitled Technique For Preparing Precursor Films And Compound Layers For Thin Film Solar Cell Fabrication And Apparatus Corresponding Thereto, which applications are expressly incorporated by reference herein.

Figure 4:
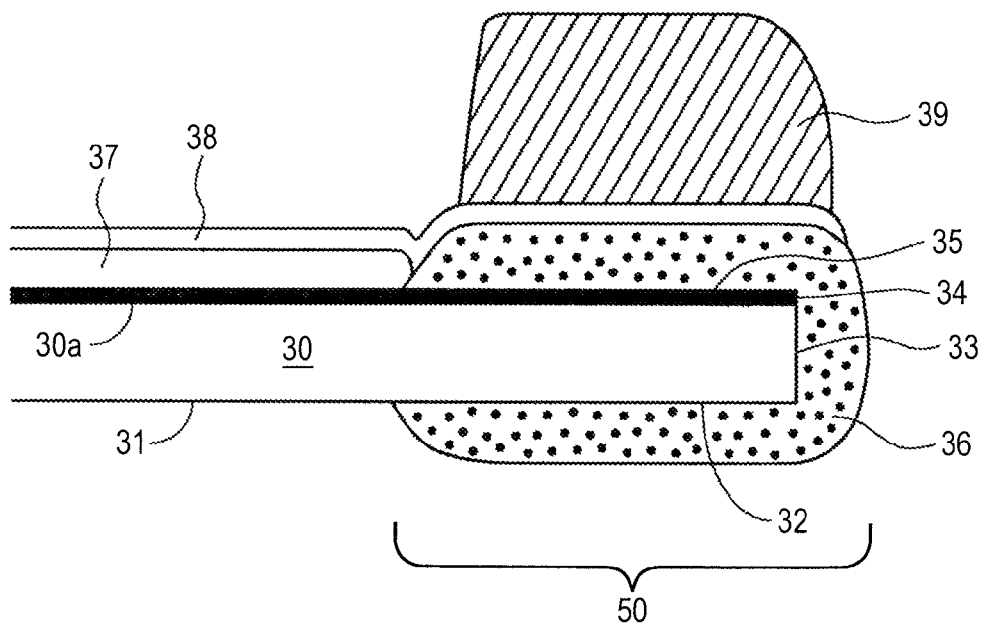
FIG. 4 shows the solar cell structure of another embodiment.

Electrodeposition forms layers only in areas that are not masked by an insulator. Therefore, by using electrodeposition for the formation of an active layer, a device structure such as the one shown in FIG. 4 may be obtained. The insulating layer, instead of being deposited, may be formed from the conductive layer 34 and/or the conductive substrate 30. For example, if the conductive substrate 30 is an aluminum-based material such as aluminum or an aluminum alloy, the edge region 50 may be anodized in an electrolyte. Anodization may dissolve the portion of the conductive layer 34 within the edge region and then form an insulating oxide layer on the anodized surface of the conductive substrate 30. If the conductive layer 34 is an anodizable material such as Ta, then the surface or substantially all the conductive layer 34 within the edge region 50 may get oxidized forming an insulating layer 36. In FIGS. 3 and 4, the finger pattern including the busbar 39 is deposited after the deposition of the transparent conductive layer 38. Alternatively, the transparent conductive layer 38 may be deposited after the deposition of the finger pattern. In this structure the transparent conductive layer 38 extends over the insulating layer 36 to establish electrical contact with the busbar 39. Active layer 37 does not extend to the region over the insulating layer 36 and under the busbar 39. This is more preferable compared to the case in FIG. 3 since it eliminates the possibility of current leakage through the portion of the active layer 37 at the edge region 50.

Figure 5:
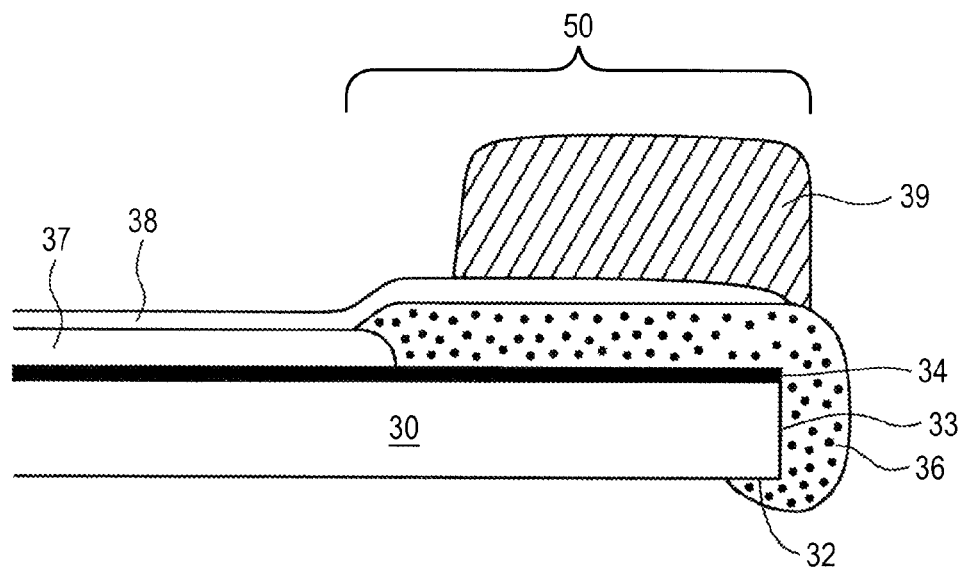
FIG. 5 shows the solar cell structure with selectively deposited active layer.

FIG. 5 demonstrates yet another embodiment of this invention. In this embodiment, the active layer 37 is deposited over the conductive layer 34 substantially everywhere over the conductive substrate 30 except at the edge region 50 where the busbar 39 would be formed. Such selective deposition of the active layer 37 may be achieved by masking the surface of the conductive layer 34 at the edge region 50 during growth of the active layer 37. In case electrodeposition is utilized for the formation of the active layer 37, the top surface of the conductive layer 34 or the top surface of the conductive substrate 30 at the edge region 50 may be rendered insulating or a material may be deposited on these surfaces on which electrodeposition cannot initiate. For example, if the conductive substrate 30 is an aluminum-based material such as aluminum or an aluminum alloy, the edge region 50 may be anodized in an electrolyte. Anodization may dissolve the portion of the conductive layer 34 within the edge region and then form an insulating oxide layer on the anodized surface of the conductive substrate 30. If the conductive layer 34 is an anodizable material such as Ta, then the surface or substantially all the conductive layer 34 within the edge region 50 may get oxidized forming insulating species. An alternative way of obtaining the structure shown in FIG. 5 comprises deposition of the active layer 37 over the whole surface of the conductive layer 34 including the edge region 50, and then removing the active layer portion from the edge region 50. Such removal may be done by physical scribing, laser scribing, chemical etching, sand blasting, etc. This approach is more wasteful compared to selective deposition of the active layer 37. After forming the active layer 37 over the selected regions of the conductive layer 37 and the conductive substrate 30, an insulating layer 36 is deposited at the edge region 50 as shown in the figure. A transparent conductive layer 38 and a finger pattern comprising fingers (not shown) and the busbar 39 are then deposited. One benefit of this approach is the fact that the insulating layer 36 is not exposed to the growth environment of the active layer 37. Solar cell absorber growth temperatures may be in the range of 200-600° C., the range typically being 400-550 C for Cu(In,Ga)(Se,S)2. Growth temperatures for typical TCO's (such as ZnO and indium tin oxide), on the other hand, is in the range of 20-200° C. By depositing the insulating layer 36 after the formation of the active layer 37, one can avoid exposing the insulating layer 36 to high temperatures and therefore may use a large variety of organic resists that can operate at temperatures up to about 200° C.

It should be noted that in the above described embodiments the insulating layer 36 is in contact with the conductive layer 34 and/or the conductive substrate 33. This way the adhesion strength of the insulating layer may be very high. If the insulating layer 36 were deposited on the active layer 37, then the strength of the structure would depend on the adhesion strength between the insulating layer 36 and the active layer 37 as well as the adhesion strength between the active layer 37 and the conductive layer 34 and/or the conductive substrate 33. Therefore, structures resulting from the methods of the present invention are reliable since the generally weak interfaces between thin film absorber layers and their substrates are eliminated.

Figure 6:
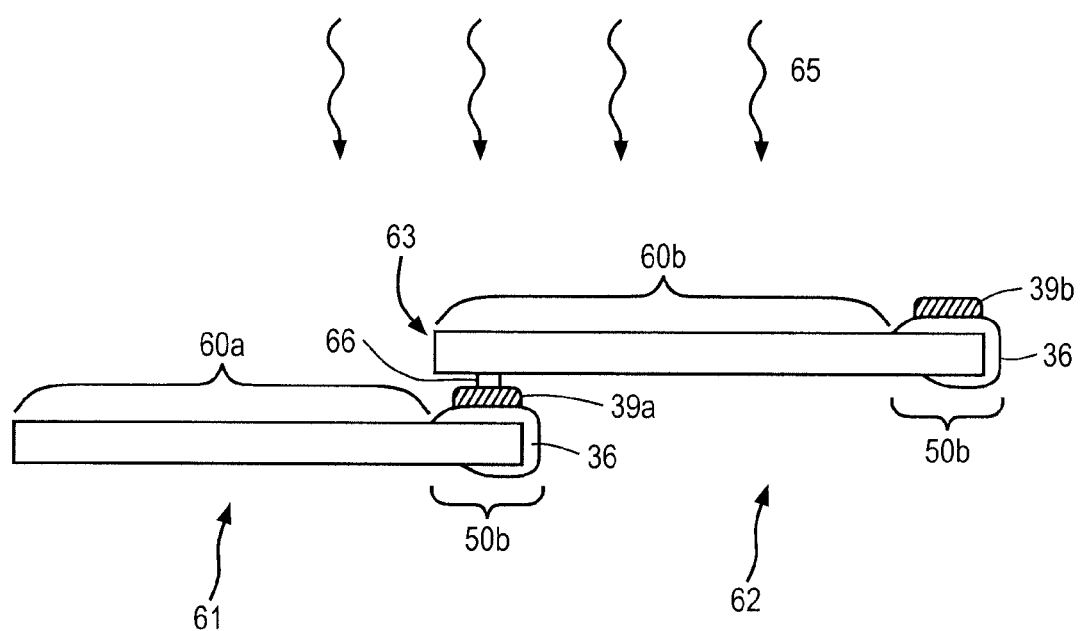
FIG. 6 shows a two-cell interconnected structure.

It should be noted that the edge region 50 in FIGS. 3, 4 and 5 is a dead region that does not generate power. This, however, does not cause efficiency drop in an interconnected module structure that shingles the solar cells as shown in FIG. 6. In FIG. 6 two solar cells, a lower cell 61 and an upper cell 62, fabricated in accordance with the teachings of this invention are shown. It should be noted that the details of the cell structure are not shown in this figure. The busbar 39a of the lower cell is aligned along the edge 63 of the upper cell such that the edge 63 extends over the edge region 50a of the lower cell 61. The edge region 50a of the lower cell 61 is the dead region of this cell, region 60a being the active region. Therefore shadowing of the illumination 65 by the upper cell 62 at the edge region 50a does not cause any power loss. By pressing the two cells together and optionally including an interconnection material 66 between the bottom surface of the top cell 62 and the busbar 39a of the first cell 61, the two cells are interconnected without loss of power. The interconnection material may be a solder, a conductive epoxy, a conductive ink etc. More cells may be added to the string of FIG. 6 to manufacture higher voltage modules. The strings may be packaged in protective materials for long term stability. It should be noted that the examples above used only on busbar along one edge of the solar cells. Two busbars along two or more edges may also be fabricated using the teachings of this invention, however at the expense of power loss due to increased dead region area. It is also possible to place the busbar away from the edges of the solar cell. When the busbar is at the edge of the device, the insulating layer 36 protects and insulates the edge of the conductive portions of the solar cells, especially if it is wrapped around the conductive substrate. This way shorting that may happen due to the interconnection material 66 seeping down along the edge of the cell is avoided.

Figure 7:
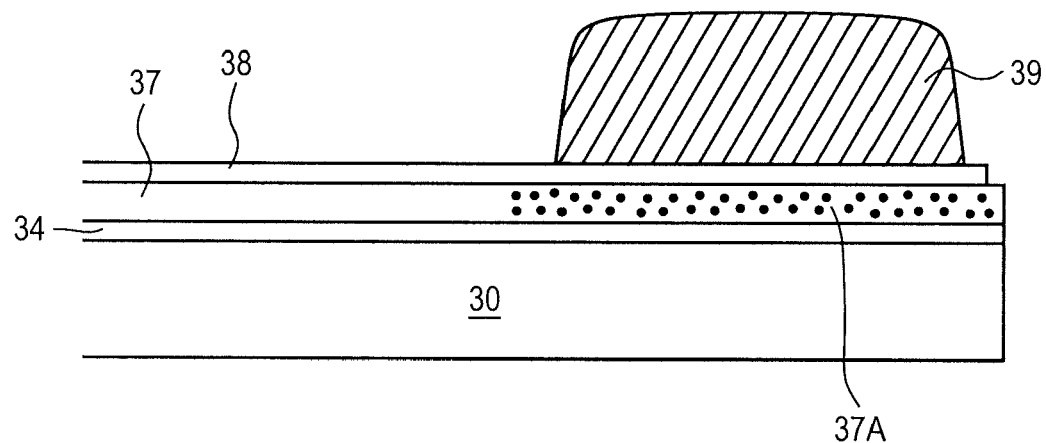
FIG. 7 shows cross-sectional view of a device structure with a high resistance absorber layer below the busbar.

In another embodiment of the present invention, a portion under the busbar and optionally under the finger patterns of a Group IBIIIAVIA compound absorber layer of the solar cell may be rendered higher resistivity compared to other portion of the absorber layer of the cell by changing the composition of the compound rather than introducing a high resistivity foreign material comprising species other than Group IB, Group IIIA or Group VIA materials. For example, FIG. 7 shows a cross sectional view of a solar cell, structure wherein the active layer 37 or absorber layer is formed over the conductive layer 34 substantially everywhere over the conductive substrate 30 and wherein a portion 37A (the dotted portion shown in FIG. 7) of the active layer 37 or the absorber layer has a higher resistance compared to the other portion of the active layer 37. The busbar 39 is formed over the portion 37A after deposition of the transparent conductive layer 38 as described before. The portion 37 may have the pattern of the busbar and the finger patterns. The portion 37A may be rendered high resistance by either adjusting the composition or the doping of the Group IBIIIAVIA compound film in this region. For example, if the Cu/(In+Ga) molar ratio in the portion 37A is lower than in other portions of the active layer 37, then the CIGS(S) layer in the portion 37A would have higher resistance than the other portions of the active layer 37. For instance, the active layer 37 may be a CIGS(S) layer with a Cu/(In+Ga) ratio in the range of 0.85-0.95, whereas the portion 37A may have a Cu/(In+Ga) ratio in the range of 0-0.8. Forming a relatively Cu-poor region within a film with a nominal Cu/(In+Ga) molar ratio may be achieved by controlling the delivery of Cu, In and/or Ga species to the portion 37A and establishing a differential between the amount of these species arriving to the portion 37A and other portions of the base or substrate. This will now be demonstrated using, as an example, an electroplating approach.

Figure 8:
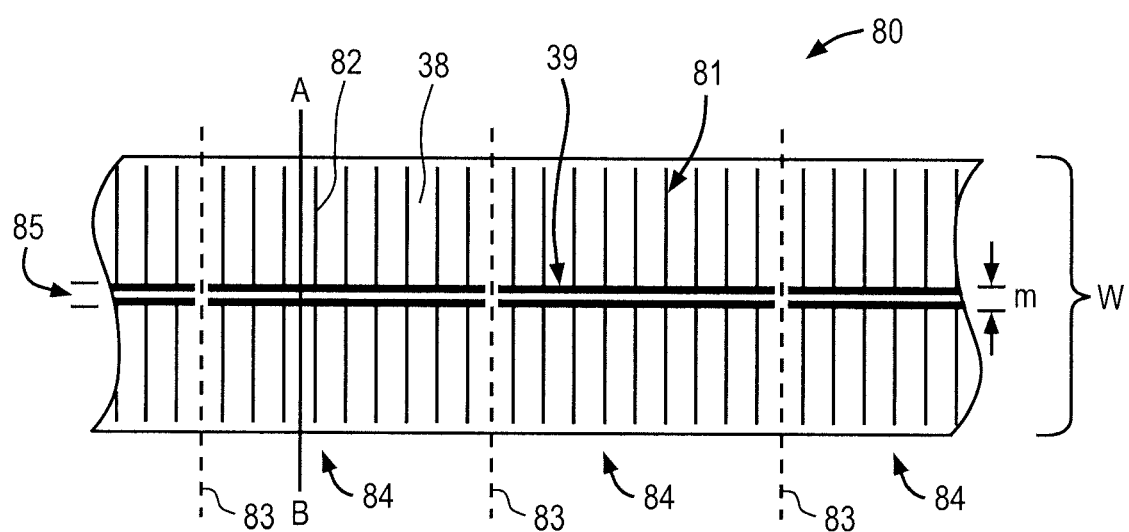
FIG. 8 shows a continuous web with all solar cell layers and finger patterns deposited.
Figure 8A:
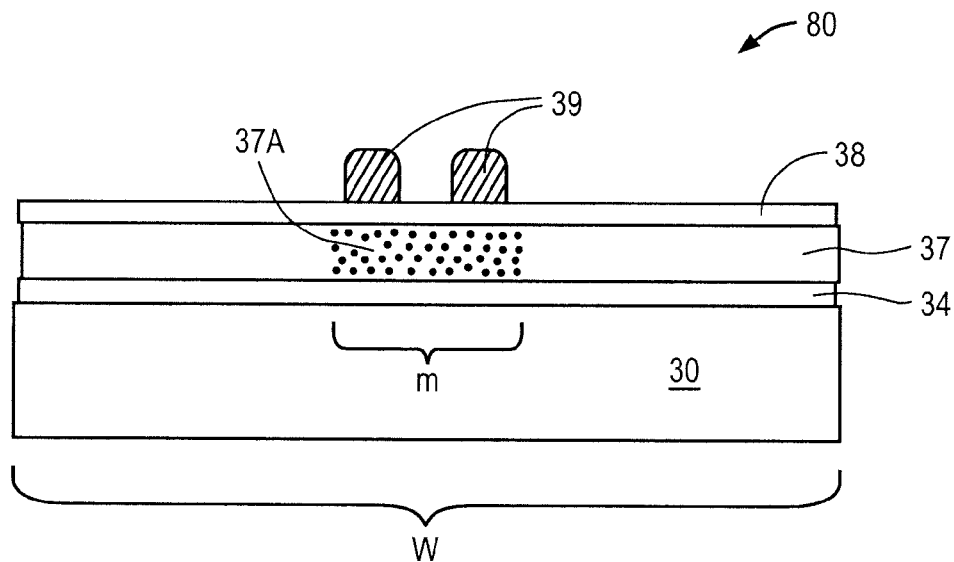
FIG. 8A shows cross-sectional view of the structure in FIG. 8.

FIG. 8 shows a top view of a flexible foil portion 80 shown in FIG. 7. As shown in FIG. 8. the conductive layer 34, the active layer 37, the transparent conductive layer 38, and connectors 82 or finger patterns comprising the busbars 39 and the fingers 81 may be formed on a selected substrate with a width W. For example, the foil portion 80 may be manufactured through a roll-to-roll process that deposits or forms the active layer 37 and the transparent conductive layer 38 on a flexible foil substrate with a width W. The width W may be in the range of 10-50 and several finger patterns 82 may be deposited over the transparent conductive layer 38, preferably also in a roll to roll manner, and the structure shown in FIG. 8 may be obtained. The finger patterns 82 may comprise the busbars 39 and the fingers 81, the fingers 81 being electrically connected to the busbars 39. The finger patterns 82 may be metallic, which may be formed by various means, preferably by screen printing and/or electroless or electroplating methods. The flexible foil portion 80 may be later cut along the dotted lines 83 into sub-portions 84 containing two finger patterns each. The sub-portion 84 may then be cut along the space between the two busbars of the two finger patterns on the sub-portion yielding two separate solar cells. Solar cells thus fabricated may later be integrated into modules through series/parallel interconnection known in the field. According to the present invention a central section 85 of the flexible foil portion 80 comprises a high resistance portion within the active layer 37 (not shown). The width "m" of the central section 85 is large enough so that the busbars are substantially deposited over this high resistance portion. A cross sectional view of the structure of the flexible foil portion 80 taken along the line A-B is shown in FIG. 8A. The high resistance portion 37A under the busbars 39 is shown as the dotted portion.

In a two stage process that involves; i) electrodeposition of Cu, In, Ga and optionally a Group VIA (such as Se) material to form a precursor layer, and ii) annealing the precursor layer, optionally in presence of more Group VIA material species, to form a CIGS(S) type absorber layer, the following approaches may be employed to form a high resistance portion 37A within the active layer 37. As an example, a precursor stack such as a Cu/Ga/In/Se stack may be electroplated on continuous flexible workpiece comprising a base comprising a flexible foil substrate coated with a conductive layer. This way a structure of "substrate/conductive layer/Cu/Ga/In/Se" may be obtained. This structure may then be converted into a "substrate/conductive layer/CIGS" configuration after annealing the precursor as described before. A preferred method of depositing the Cu, Ga and In layers of the stack is a roll-to-roll electroplating approach where Cu, Ga and In layers are deposited in at least three different plating units one after another. Selenium electroplating may also be carried out on the last layer, such as on the In layer, by employing an additional plating unit. In an exemplary roll to roll process, a continuous flexible workpiece is unwrapped from a supply roll, the precursor is formed in the process tool and the processed continuous flexible workpiece is wrapped around a receiving roll. The process tool may contain deposition units and doping unit to form the precursor stack. In addition, the tool may include an annealing unit to react and convert the precursor stack to an absorber layer.

Figure 9:
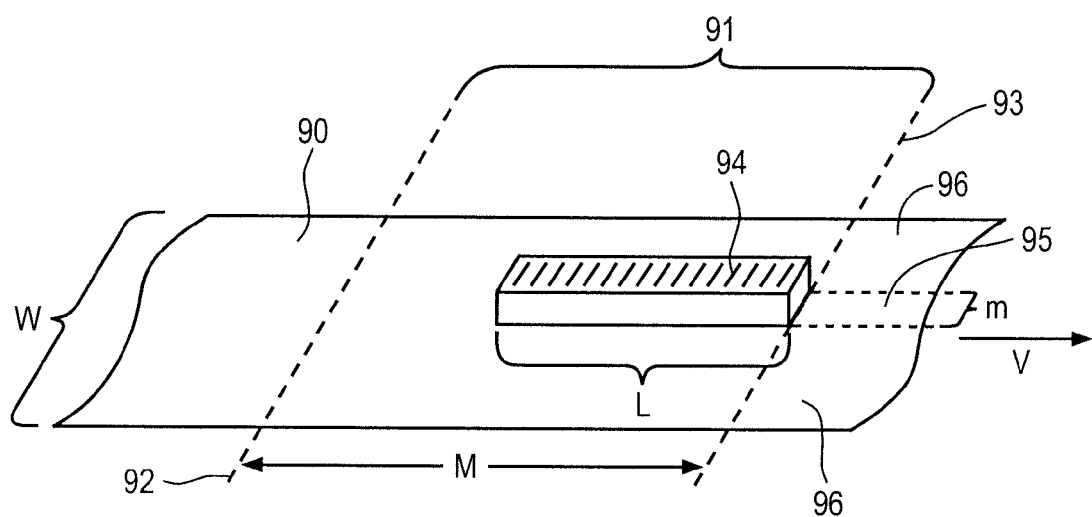
FIG. 9 is a schematic of a Cu plating cell used in accordance with an embodiment of the present invention.
Figure 9A:
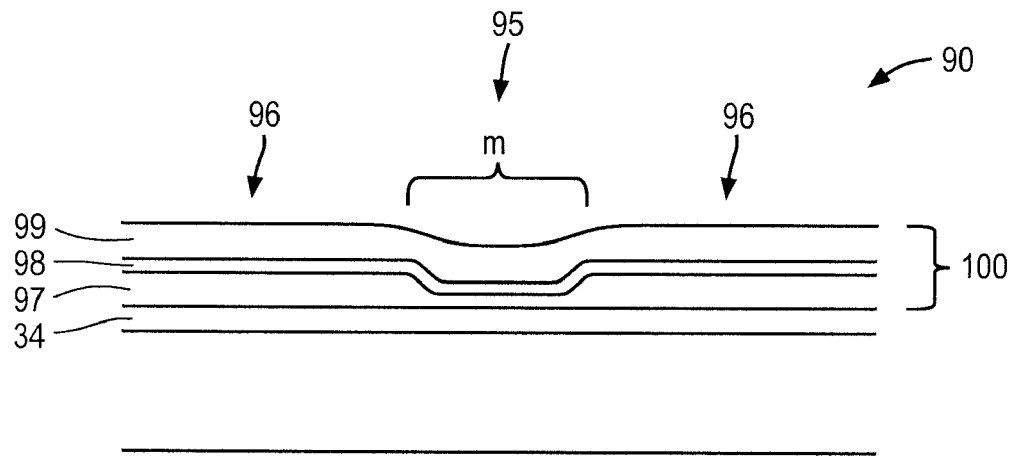
FIG. 9A is a cross sectional view of a structure comprising Cu, In and Ga produced by electroplating.

FIG. 9 schematically represents a Cu electroplating unit or section of a roll-to-roll electroplating system to form the above exemplary stack. Any point on the base 90 enters the plating region 91 at line 92 and gets plated with Cu until it exits the plating region 91 at line 93 as the base 90 is moved from left to right at a speed V. Details of the plating cell is not shown in the figure but Cu deposition is carried out on the top surface of the base 90 through an anode placed above the top surface in the plating region 91 and a plating solution fills the space between the top surface and the anode (not shown). A mask 94 is placed above the top surface of the base 90 within the plating region 91. The mask 94 may have a width "m" and a length "L", and it may or may not touch the top surface but it substantially blocks Cu deposition on a portion 95, or masked portion of the top surface that travels right under it while another portion 96 or unmasked portion of the top surface receives deposited material. As a result when a section of the base 90 emerges from the plating region 91, the Cu thickness deposited on the masked portion 95 of the top surface would be smaller than the Cu thickness deposited on the unmasked portion 96. When the Cu plated section is further plated with Ga and In, the masked portion 95 would have a lower Cu/(In+Ga) ratio than the unmasked portion 96. This is shown in FIG. 9A which shows a cross-sectional view of a base plated with Cu/Ga and In as described above. As can be seen from this figure the thickness of the Cu layer 97 at the central masked portion 95 is smaller than the thickness of the Cu layer 97 at the unmasked portion 96. Thicknesses of the Ga layer 98 and In layer 99 are uniform throughout since in this example no mask was used in the Ga and In plating units. It should be appreciated that when the metal stack 100 is reacted with a Group VIA material, the masked portion 95 with a width "m" would have a higher resistance than the unmasked portion 96.

It should be noted that the Cu/(In+Ga) ratio within the masked portion 95 may be adjusted by adjusting the amount of the deposition blockage by the mask 94, which may be a stationary mask or a mask that moves during film deposition. As the length "L" of the mask 94 increases, deposited Cu thickness in the masked portion decreases and therefore the Cu/(In+Ga) ratio also decreases. If "L" is made equal to the length "M" of the plating region 91, the Cu/(In+Ga) molar ratio may be brought down to zero, which means that after the annealing/reaction step an (indium-gallium)-(sulfo)-selenide layer free from Cu may be formed in the masked portion 95.

It should be noted that the above result may also be obtained by enhancing deposition of In and/or Ga at a location where a low Cu/(Ga+In) is desired. In this case a uniform Cu layer may be deposited on the top surface, however In and/or Ga deposition may be partially masked everywhere except at the location so that more In/Ga is deposited at the location yielding a low Cu/(In+Ga) molar ratio.

In another aspect of the present invention a high resistance portion within a Group IBIIIAVIA active layer may be formed by introducing dopants everywhere throughout the active layer except in the portions where high resistivity may be desired. It should be noted that, especially for Cu/(In+Ga) ratios in the range of 0.5-0.9, addition of a dopant such as Na, Li, K, etc., in a CIGS(S) layer lowers its resistivity by at least 10-100 times and improves the quality of the layer so that efficient solar cells may be fabricated on it. Without the doping, CIGS(S) material is high resistivity and not suitable for high efficiency device making. Since sections of the active layer under the busbars and finger patterns do not create power, they may be high resistivity. Reduced doping at a location in the CIGS layer may be achieved by masking during dopant introduction so that portions that do not receive dopant such as Na during dopant deposition, grow high resistivity after CIGS formation. This way, CIGS(S) layer at the selected regions such as right under the busbars may be grown with higher resistivity.

As described before roll-to-roll processing of CIGS(S) type solar cells is attractive in terms of lower cost compared to batch process approaches. After a conductive base is coated with a CIGS(S) layer, a CdS layer, and a transparent conductive layer, it may be cut into individual solar cells either before or after finger pattern deposition. Cutting may be carried out using a mechanical cutting device or laser. In any case, it is preferable to have a high resistance CIGS(S) portion where such cutting is carried out. This way, shorting between the top transparent conductive layer and the base may be minimized. Laser cutting of Group IBIIIAVIA compound layers is especially challenging. Heat generated during laser cutting changes the stoichiometry or composition of the compound along the cut portion, giving rise to more Group IB-rich material along the cut. For a Cu(In,Ga)Se$_2$ layer with Cu/(In+Ga) ratio of 0.9, for example, one may find portions with Cu/(In+Ga) ratio of higher than 1.0, even higher than 2.0, after a laser cut. These portions are right next to the laser cut where temperatures rise. As described before, Group IB-rich portions, such as Cu-rich portions have much lower resistivity than Cu-poor portions of the compound layer. For example, whereas Cu-rich regions may have a resistivity of $10^{-1}$-$10^{-1}$ ohm-cm, the Cu-poor portions may have a resistivity of 100-$10^4$ ohm-cm. As may be appreciated, if a ZnO/CIGS(S)/base structure is cut with a laser, the Cu-rich areas formed along the cut within the CIGS(S) layer may introduce shunting paths between the ZnO and the base, causing solar cell performance to deteriorate. One aspect of the present invention is to introduce Group IB-poor portions within the Group IBIIIAVIA compound layer at locations where such cuts would be made. For example, by using the masking technique described in reference to FIGS. 9 and 9A, a Cu(In,Ga)Se$_2$ layer may be grown on a base and selected portions of the Cu(In,Ga)Se$_2$ layer may be rendered Cu-poor (or they may even be grown as (In,Ga)-selenide material with no Cu). Cuts may then be made at these selected portions without the adverse effect of forming Cu-rich phases during the cuts.

Figure 10:
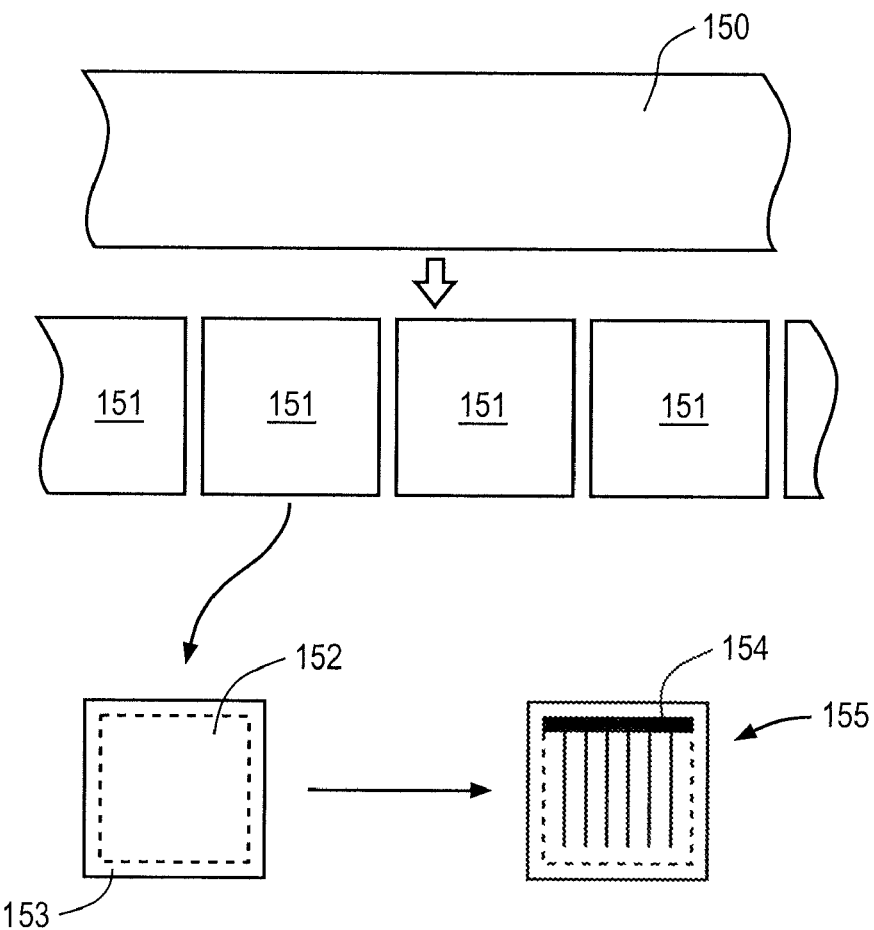
FIG. 10 shows the process steps of making CIGS(S) type solar cells.

The cuts may be made after a transparent conductive layer such as ZnO is deposited on the CIGS(S) layer, or after a transparent conductive layer as well as the finger patterns are deposited. Alternately, cuts may be made after a CIGS(S) layer is deposited on a base as shown in FIG. 10. FIG. 10 shows an exemplary process flow where a roll-to-roll technique is used to form a CIGS(S) layer and an optional buffer layer (such as CdS) on a base forming a base/CIGS(S)/buffer structure 150. The structure 150 is then cut into pieces 151. A transparent conductive oxide (TCO) 152 such as ZnO is deposited on individual pieces 151. The resulting structure has an exclusion region 153 along the edges of the pieces 151. Such exclusion region 153 may be obtained by masking the edges of the pieces 151 during deposition of the TCO or by depositing the TCO over the whole surface and then removing the portion of the TCO from the exclusion region 153. The removing step may be carried out through physical, chemical or electrochemical means. One preferred method is to remove the TCO layer from the exclusion region 153 by electro-etching. An electroetching solution such as an acidic solution may be used for this purpose and the TCO layer within the exclusion region 153 may be applied a voltage with respect to an electrode touching the solution. Electrochemical reaction may then remove the TCO from the exclusion region 153. Finger patterns 154 may be deposited over the TCO layer to form solar cell 155.

Electrochemical removal of ZnO may also be utilized before the base is cut into individual pieces. In this case a roll-to-roll process may be used to form a base/CIGS(S)/buffer/TCO structure, with or without the finger patterns over the TCO layer. The TCO layer, such as ZnO, may be removed from specific portions where the cuts would be made. Preferably, electro-etching technique is used to remove the TCO from the specific regions. These specific regions become the exclusion regions 153 shown in FIG. 10 after the cutting step.

Although the present invention is described with respect to certain preferred embodiments, modifications thereto will be apparent to those skilled in the art.

I claim:

1. A solar cell structure, comprising:
   a base;
   a single contiguous layer formed on the base, the single contiguous layer including a first portion and a second portion that is adjacent to and different than the first portion such that each of the first and the second portions are each formed on the base and the second portion forms a pattern, wherein the electrical resistivity of the second portion is higher than the electrical resistivity of the first portion, wherein the first portion forms an absorber to receive light, and wherein and the first portion comprises a Group IA material while the second portion does not contain the Group IA material;
   a transparent conductive layer formed on the single contiguous layer; and
   a metallic connector formed on the transparent conductive layer, the metallic connector having a primary connector and secondary connectors attached to the primary connector, wherein the primary connector is substantially positioned over the pattern formed by the second portion of the single contiguous layer that is adjacent to the first portion of the single contiguous layer without extending over the first portion of the single contiguous layer.

2. The structure of claim 1, wherein the first portion includes at least one Group IB material, at least one group IIIA material and at least one Group VIA material, and wherein the second portion includes at least two materials from a set of materials including at least one Group IB material, at least one group IIIA material and at least one Group VIA material.

3. The structure of claim 2, wherein the Group IB material comprises Cu, the Group IIIA material comprises at least one of In and Ga, and the Group VIA material comprises at least one of Se and S.

4. The structure of claim 3, wherein the transparent conductive layer is a transparent conductive oxide layer.

5. The structure of claim 4 further including a buffer layer between the transparent conductive oxide layer and the layer.

6. The structure of claim 1, wherein the primary connector includes a bulbar, and the secondary connectors include fingers.

7. The structure of claim 1, wherein the base includes a substrate and a contact layer and the layer is formed over the contact layer.

8. The structure of claim 7, wherein the substrate is a metallic foil.

9. The structure of claim 1, wherein the Group IA material is one of Li, Na and K.

10. A solar cell structure, comprising:
    a base;
    a layer formed on the base, and including a first portion and a second portion that is adjacent to and different than the first portion such that each of the first and the second portions are each formed on the base and the second portion forms a pattern, wherein the first portion includes at least one Group IB material and at least one Group IIIA material, wherein the second portion includes at least one Group IB material and at least one Group IIIA material, wherein the molar ratio of Group IB material to Group IIIA material in the second portion is lower than the molar ratio of Group IB material to Group IIIA material in the first portion, and wherein the electrical resistivity of the second portion is higher than the electrical resistivity of the first portion, and wherein the first portion forms an absorber layer;

a transparent conductive layer formed on the layer; and a metallic connector formed on the transparent conductive layer, the metallic connector having a primary connector and secondary connectors attached to the primary connector, wherein the primary connector is substantially positioned over the pattern formed by the second portion of the layer that is adjacent to the first portion of the layer without extending over the first portion of the layer.

11. The structure of claim 10, wherein the molar ratio of Group IB material to Group IIIA material in the second portion is less than 0.8 and the molar ratio of Group IB material to Group IIIA material in the first portion is more than 0.8.

12. The structure of claim 10, wherein the primary connector includes a busbar, and the secondary connectors include fingers.

13. The structure of claim 10, wherein the base includes a substrate and a contact layer and the layer is formed over the contact layer.

14. The structure of claim 13, wherein the substrate is a metallic foil.

15. The structure of claim 10, wherein the Group IB material comprises Cu, the Group IIIA material comprises at least on of In and Ga, and wherein the first portion and the second portion further include a Group VIA material that comprises at least one of Se and S.

16. The structure of claim 15, wherein the transparent conductive layer is a transparent conductive oxide layer.

17. The structure of claim 16, further including a buffer layer between the transparent conductive oxide layer and the layer.

18. The structure of claim 10, wherein at least the first portion further comprises a Group IA material.

19. The structure of claim 18, wherein the Group IA material is one of Li, Na and K.

* * * * *